United States Patent [19]

Okumura et al.

[11] Patent Number: 4,891,560
[45] Date of Patent: Jan. 2, 1990

[54] MAGNETRON PLASMA APPARATUS WITH CONCENTRIC MAGNETIC MEANS

[75] Inventors: Katsuya Okumura, Yokohama; Atsumu Tezaki, Kawasaki, both of Japan

[73] Assignee: Kabushiki Kaisha Toshiba, Kawasaki, Japan

[21] Appl. No.: 330,933

[22] Filed: Mar. 27, 1989

Related U.S. Application Data

[63] Continuation of Ser. No. 96,457, Sep. 15, 1987, abandoned.

Foreign Application Priority Data

Sep. 18, 1986 [JP] Japan .................. 61-220738

[51] Int. Cl.$^4$ .................................... C23C 15/00
[52] U.S. Cl. .................. 315/111.41; 204/298; 313/161; 313/231.31
[58] Field of Search .......... 204/298 PM, 298 ME, 204/298 FP, 298 CM; 315/111.41, 111.21; 313/161, 231.31

[56] References Cited

U.S. PATENT DOCUMENTS

| | | | |
|---|---|---|---|
| 4,282,083 | 8/1981 | Kertese et al. | 204/298 FP |
| 4,361,472 | 11/1982 | Morrison, Jr. | 204/298 X |
| 4,461,688 | 7/1984 | Morrison, Jr. | 204/298 PM X |
| 4,606,802 | 8/1986 | Kobayashi et al. | 204/298 PM X |
| 4,631,106 | 12/1986 | Nakazoto et al. | 204/298 X |
| 4,652,358 | 3/1987 | Deppisch et al. | 204/298 PM |
| 4,724,058 | 2/1988 | Morrison, Jr. | 204/298 X |
| 4,761,219 | 8/1988 | Sasaki et al. | 204/298 X |

*Primary Examiner*—James J. Groody
*Assistant Examiner*—Mark R. Powell
*Attorney, Agent, or Firm*—Finnegan, Henderson, Farabow, Garrett and Dunner

[57] ABSTRACT

This invention discloses a magnetron plasma apparatus capable of increasing a sputtering or erosion region. Parallel magnetic fields respectively of first and second magnets having different polarities cancel each other in an ion sheath portion which is not a plasma region, so that a parallel magnetic field intensity is vertically distributed and maximized in a region having a height larger than a width of the ion sheath portion. As a result, cyclotron movement of dissociated electrons occurs in a region separated from the ion sheath portion, and a plasma density of ions is maximized in a ring of the cyclotron movement. Therefore, ions are diffused in the plasma, reach the ion sheath portion, and then are emitted onto a target, thereby increasing the sputtering or erosion region.

10 Claims, 6 Drawing Sheets

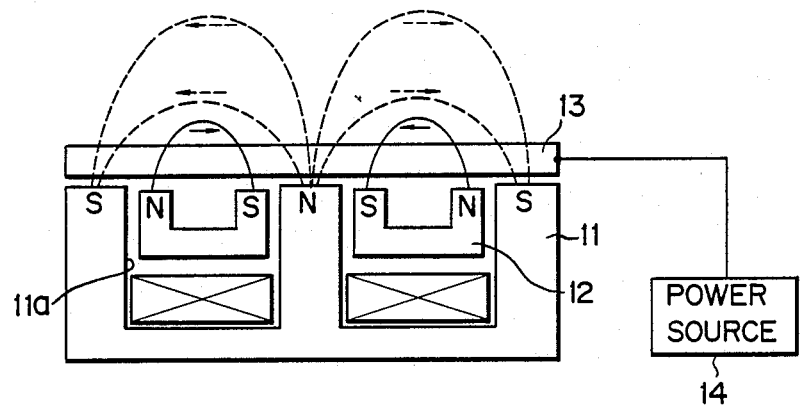
F I G. 7

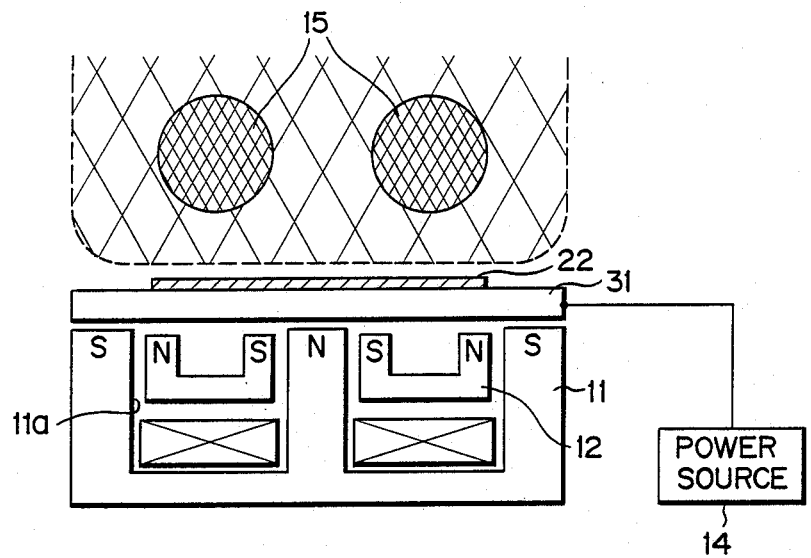
F I G. 10
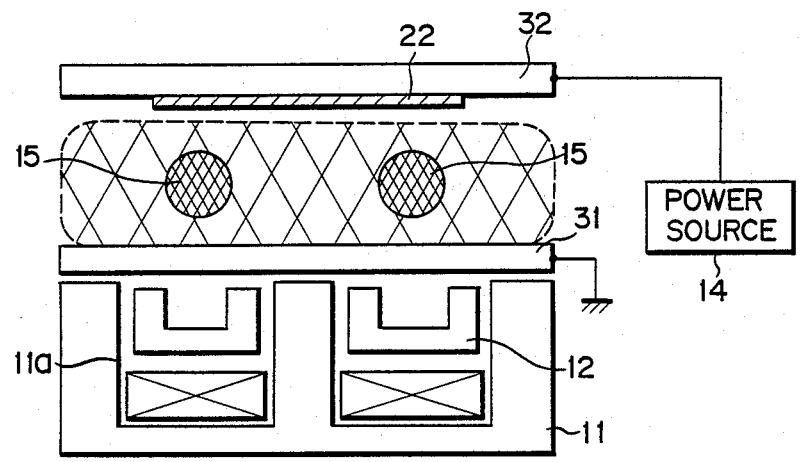
F I G. 11

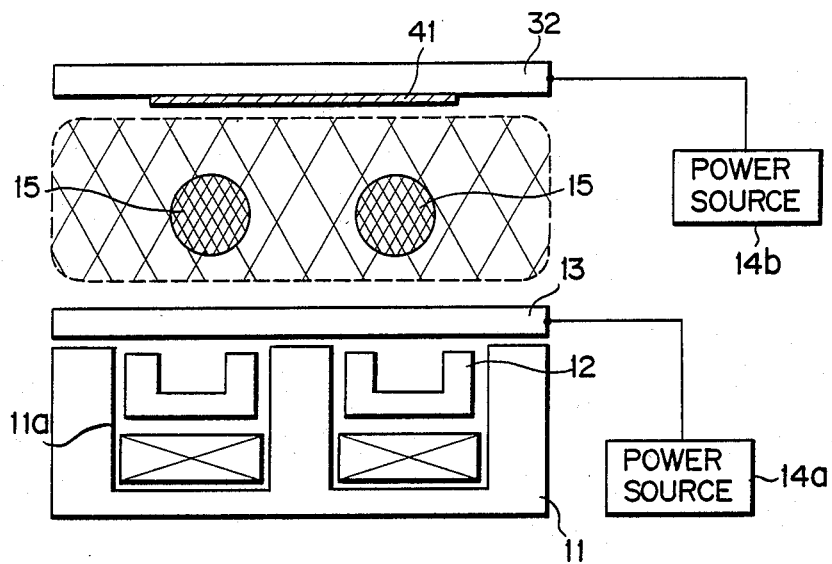
F I G. 12
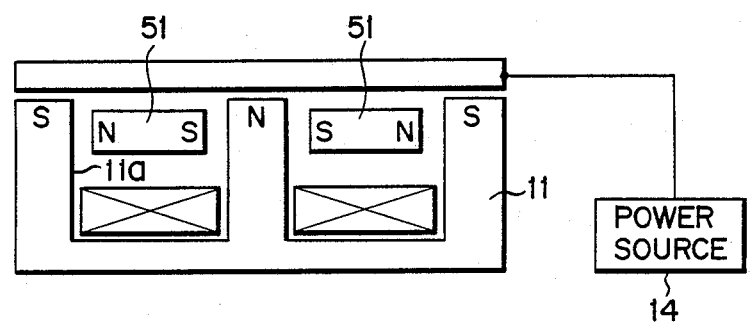
F I G. 13

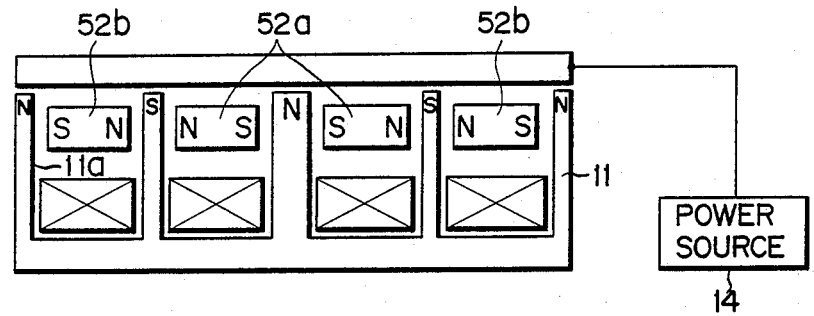
F I G. 14
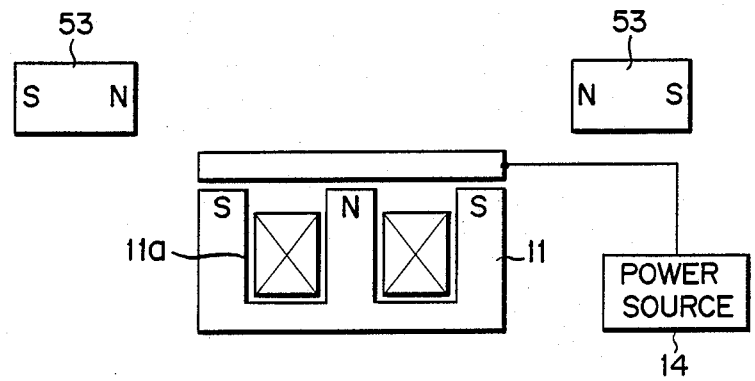
F I G. 15
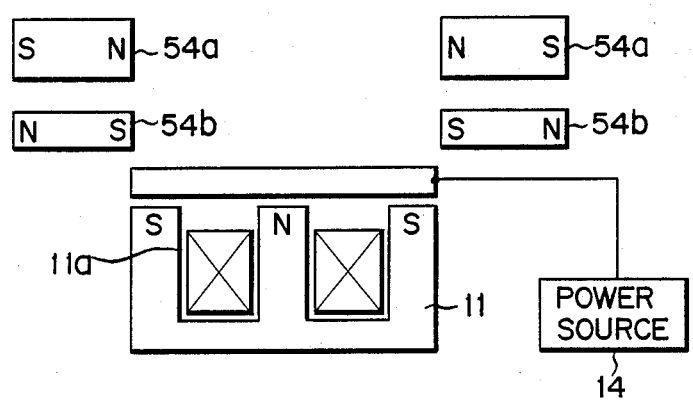
F I G. 16

MAGNETRON PLASMA APPARATUS WITH CONCENTRIC MAGNETIC MEANS

This application is a continuation of application Ser. No. 07/096,457, filed Sept. 15, 1987 now abandoned.

BACKGROUND OF THE INVENTION

The present invention relates to a magnetron plasma apparatus and, more particularly, to a magnetron plasma apparatus used for sputtering or etching of a semiconductor substrate.

FIG. 1 shows an example of a conventional magnetron sputtering apparatus. In FIG. 1, disk-like target 2 is placed on concentric electromagnet 1, and lines 3 of magnetic force of electromagnet 1 leak onto the surface of target 2. As shown in FIG. 2, a parallel magnetic field on the surface of target 2 is radial with respect to a central axis of electromagnet 1. Target 2 is connected to plasma power source 4 so as to be a cathode. A plasma is generated above target 2 by source 4.

In the apparatus having the above arrangement, dissociated electrons in the plasma perform doughnut-like cyclotron movement which is caused by the electric field near target 2 and the parallel magnetic field near the surface of target 2. The dissociated electrons are looped in a ring of the doughnut-like cyclotron movement due to the cyclotron movement of the dissociated electrons, thereby increasing a plasma density.

This phenomenon will be described in more detail with reference to FIGS. 3 and 4. As shown in FIG. 3, an ion sheath portion is formed between the plasma and the target. No plasma is present in this ion sheath portion. Without the parallel magnetic field, distribution of the plasma density along distance from the target surface is substantially uniform above the ion sheath portion, as shown in FIG. 3. However, with the parallel magnetic field, the dissociated electrons perform cyclotron movement due to the parallel magnetic field and the electric field. As a result, as shown in FIG. 4, the plasma density is increased. More specifically, when the intensity of the magnetic field is smaller than a critical intensity (normally about 100 gauss), the plasma density is rarely increased. However, when the intensity of the magnetic field is larger than the critical intensity, both the plasma density is increased with a magnetic field intensity. In this case, since the parallel magnetic field is monotonously decreased against the distance from the target surface, the plasma density is maximized near an interface where plasma contacts the ion sheath. On the other hand, the parallel magnetic field intensity on the target surface is maximized at a central portion (denoted by A) between both magnetic poles of the electromagnet, as shown in FIG. 5. That is, a maximum region of the plasma density is an extremely localized region, i.e., a region near the surface which contacts the ion sheath portion at portion A.

In the above sputtering apparatus, a voltage of 500 to 800 V is normally applied to the ion sheath portion, so that ions are extracted from the plasma by the electric field, accelerated, and then emitted onto the target, thereby causing sputtering.

According to the above sputtering apparatus, however, maximum region 5 of the plasma density caused by the cyclotron movement of the dissociated electrons is localized near the ion sheath surface, as shown in FIG. 6. Therefore, ions are extracted from this localized region by the voltage applied to the ion sheath portion. For this reason, sputtering or erosion occurs at only localized region 6 of the target. As a result, the effectiveness of the target is degraded, uniformity of a film thickness is degraded when a film is deposited on a substrate placed opposite to the target, and nonuniformity of step coverage appears.

SUMMARY OF THE INVENTION

It is, therefore, an object of the present invention to provide a magnetron plasma apparatus capable of increasing a sputtering region or an erosion region.

In order to achieve the above object of the present invention, there is provided a magnetron plasma apparatus comprising: plasma generating means for generating a plasma above an electrode; and parallel magnetic field generating means for providing a distribution in a direction perpendicular to an electrode surface to a magnetic field intensity parallel to the electrode surface, and setting a maximum value of the distribution of the parallel magnetic field in a region where a plasma is generated.

The magnetic field intensity is distributed such that the parallel magnetic field intensity is maximized in a region having a height larger than an ion sheath width and is lower than the critical intensity near the ion sheath portion. As a result, since cyclotron movement occurs in a region separated from the ion sheath portion, the ion density is maximized in the plasma, ions are diffused in the plasma, reach the ion sheath surface, and then are emitted onto the target. Therefore, the sputtering region or the erosion region is increased.

BRIEF DESCRIPTION OF THE DRAWINGS

FIG. 7 is a view of the main part of a magnetron sputtering apparatus according to the present invention;

FIG. 10 is a sectional view of the main part of a magnetron etching apparatus according to the present invention;

FIG. 11 is a sectional view of a magnetron etching apparatus of a type different from that of the magnetron etching apparatus shown in FIG. 10;

FIG. 12 is a sectional view of the main part of a magnetron sputtering apparatus of a type different from that of the magnetron sputtering apparatus shown in FIG. 7; and FIGS. 13 to 16 are respective views of the main parts, especially magnetic field generators of magnetron plasma apparatuses according to the present invention.

DETAILED DESCRIPTION OF THE PREFERRED EMBODIMENTS

Embodiments of the present invention will be described below with reference to the accompanying drawings. FIG. 7 is a view showing a case wherein a magnetron plasma apparatus according to the present invention is used as a sputtering apparatus.

Figure 1:
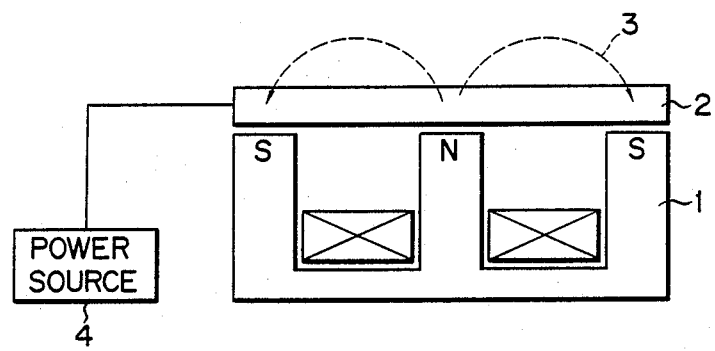
FIG. 1 is a sectional view of the main part of a conventional magnetron sputtering apparatus.
Figure 2:
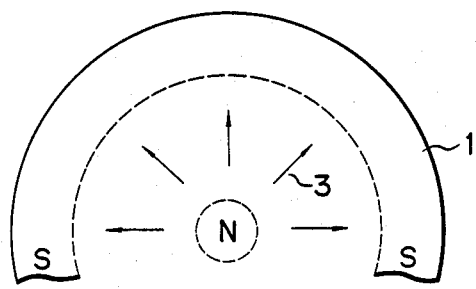
FIG. 2 is a plane view showing spread lines of magnetic force generated by the sputtering apparatus shown in FIG. 1.
Figure 3:
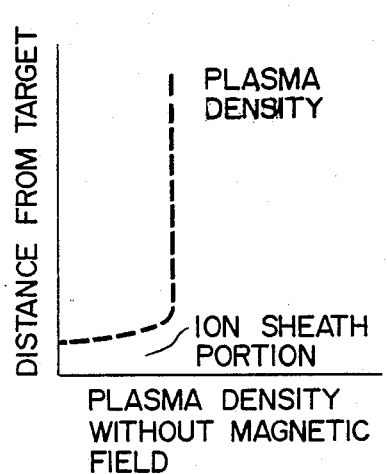
FIG. 3 is a graph for explaining a relationship between a distance from a target and a plasma density obtained when no magnetic field is generated in the sputtering apparatus shown in FIG. 1.
Figure 4:
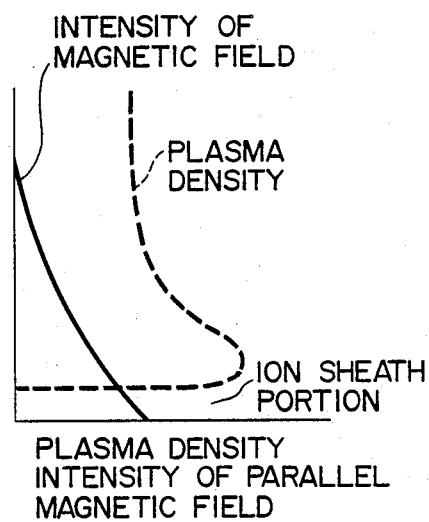
FIG. 4 is a graph for explaining a relationship between the distance from the target and the plasma density obtained when the magnetic field is generated in the sputtering apparatus shown in FIG. 1.
Figure 5:
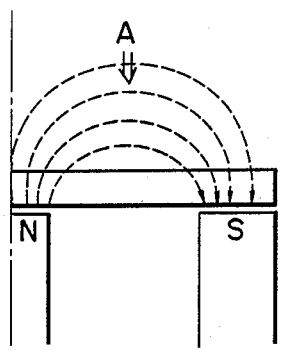
FIG. 5 is a sectional view for explaining the parallel lines of magnetic force on a target surface in the sputtering apparatus shown in FIG. 1.
Figure 6:
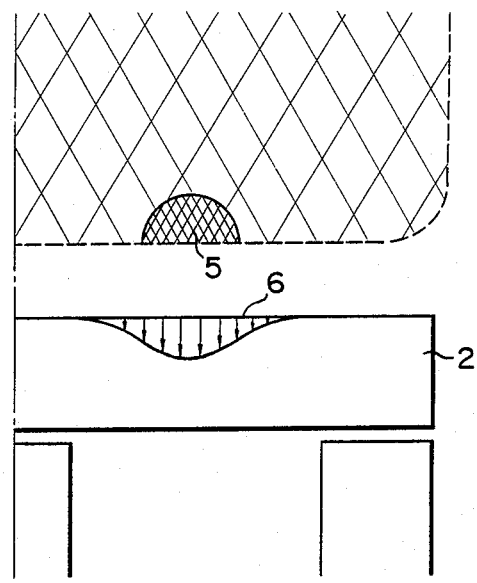
FIG. 6 is a view for explaining an erosion region according to the sputtering apparatus shown in FIG. 1.
Figure 8:
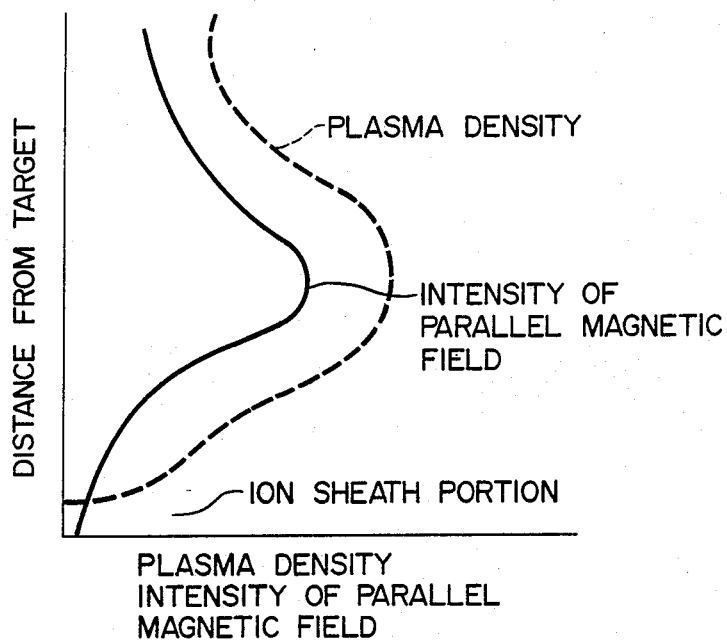
FIG. 8 is a graph showing a relationship between a distance from a target and a magnetic field intensity according to a magnetic field generator of the magnetron sputtering apparatus shown in FIG. 7.
Figure 9:
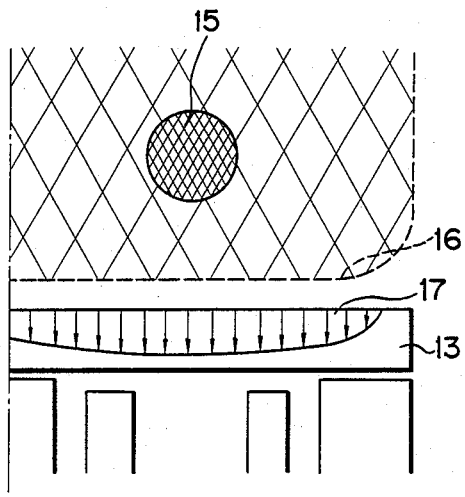
FIG. 9 is a view for explaining an erosion region according to the magnetron sputtering apparatus shown in FIG. 7.

Ring-like permanent magnet 12 having polarities different from those of concentric electromagnet 11 having a maximum outer diameter of 200 mm is embedded in recess 11a of electromagnet 11. Disk-like target 13 is placed on electromagnet 11 and serves as a cathode. Plasma power source 14 is connected to target 13. In this arrangement, magnetic field intensities of electromagnet 11 and permanent magnet 12 are respectively adjusted such that a parallel magnetic field intensity at an ion sheath portion is decreased below a critical intensity, and that parallel magnetic field intensities of electromagnet 11 and permanent magnet 12 become higher than the critical intensity in a region sufficiently separated from the ion sheath portion. More specifically, in a region 3 mm above the surface of target 13, directions of the parallel magnetic fields of electromagnet 11 and permanent magnet 12 are respectively set to oppose each other so that the respective parallel magnetic fields almost cancel each other, becoming 100 gauss or less. On the other hand, in a region 15 mm above the surface of target 13, the parallel magnetic field of permanent magnet 12 is set to be substantially zero. As a result, a magnetic field of 300 gauss is obtained in the region 15 mm above target 13 (FIG. 8). Under the condition such that the above parallel magnetic field distribution is obtained, an argon plasma is generated at $2 \times 10^{-3}$ Torr. In this case, an ion sheath width is about 3 mm. In addition, a measurement result of a width of an erosion region under such conditions is as shown in FIG. 9. In a conventional apparatus without permanent magnet 12 and electromagnet 11, only about 30% of the target is eroded. However, in the embodiment shown in FIG. 7, substantially the entire surface of the target is eroded. The reason for this is as follows. That is, the parallel magnetic field intensity is maximized in the region having a height larger than the ion sheath width, and hence the cyclotron movement caused by Ar ions occurs in the region having a height larger than the ion sheath width. As a result, since concentration region 15 of the plasma density is separated from ion sheath surface 16, Ar ions are diffused in the plasma, reach surface 16 after diffusion, and then are emitted onto target 13. Note that a portion denoted by reference numeral 17 is an erosion region.

The embodiment shown in FIG. 7 has an arrangement in which doughnut-like permanent magnet 12 having polarities different from those of concentric electromagnet 11 is disposed in recess 11a of electromagnet 11. By adjusting the respective magnetic field intensities of electromagnet 11 and permanent magnet 12, the magnetic field intensity can be distributed such that the parallel magnetic field intensity is maximized in the region having a height larger than the width of the ion sheath portion and becomes weaker than the critical intensity near the ion sheath portion. As a result, since the cyclotron movement occurs in the region surfficiently separated from the ion sheath portion, the ion density is maximized in the plasma, ions are diffused in the plasma, reach ion sheath surface 16, and then are emitted onto target 13. For this reason, erosion region 17 can be obtained larger than that made by a conventional apparatus.

In the above embodiment, an electromagnet can be used instead of the above permanent magnet. In addition, uniformity of erosion can be improved by changing polarities of the electromagnet as a function of time.

FIG. 10 is a view showing a case wherein the magnetron plasma apparatus of the present invention is used as an etching apparatus. The etching apparatus shown in FIG. 10 has an arrangement in which substrate 22 to be etched having a diameter of 150 mm is placed on electrode 31 on electromagnet 11 and permanent magnet 12. Using the apparatus having such an arrangement, carbon tetrachloride $CCl_4$ gas and chlorine $Cl_2$ gas were supplied to the apparatus to generate a plasma of a mixture of these gases, and an Al alloy film was patterned by reactive ion etching. As a result, good etching was achieved with uniformity of 5% and a etching rate of 1 $\mu$m/min.

FIG. 11 is a view showing a case wherein the magnetron plasma apparatus according to the present invention is applied to an etching apparatus of a type different from that of the etching apparatus shown in FIG. 10. In FIG. 11, arrangements of concentric electromagnet 11 and doughnut-like permanent magnet 12 are the same as those in FIG. 7. Disk-like electrode 31 is disposed on electromagnet 11 and permanent magnet 12 and is grounded. Counterelectrode 32 supporting substrate 22 to be etched on its lower surface is provided above electrode 31. Note that in FIG. 11, a support mechanism for substrate 22 is omitted. Power source 14 for generating a plasma is connected to counterelectrode 32 such that counterelectrode 32 serves as a cathode.

In the apparatus having such an arrangement, substrate 22 is set on counterelectrode 32. Chlorine $Cl_2$ gas is supplied in the apparatus to generate a plasma, and substrate 22 is etched to a depth of 5 $\mu$m. Since etching to a depth of 5 $\mu$m is generally deep etching, an etching rate must be increased. For this reason, a cooling mechanism (not shown) is provided to counterelectrode 32, thereby increasing power of source 14.

As a result, a high etching rate of 2 $\mu$m/min together with uniformity of $\pm 5\%$ can be obtained. In addition, according to this etching apparatus, since a magnet and the like need not be provided below counterelectrode 32 on which substrate 22 is placed, the substrate can be easily and effectively cooled.

FIG. 12 is a view of a sputtering apparatus of a type different from that of the magnetron sputtering apparatus shown in FIG. 7. In this apparatus, the arrangements of electromagnet 11 and permanent magnet 12 are the same as those of the sputtering apparatus shown in FIG. 7. In FIG. 12, target 13 is provided on electromagnet 11 and permanent magnet 12, and counterelectrode 32 is provided above target 13. Substrate 41 on which a film is to be deposited is supported on the lower surface of counterelectrode 32. First and second power sources 14a and 14b are respectively connected to target 13 and counterelectrode 32.

In the apparatus having such an arrangement, a power ratio of source 14a to source 14b is set at 30 to 50, thereby generating an Ar plasma. When bias sputtering is performed under such a condition, a film can be deposited in a very small space of 1 μm without pinholes.

FIG. 13 is a view of the main part, especially a magnetic field generator, of the magnetron plasma apparatus according to the present invention.

In FIG. 13, flat ring-like permanent magnet 51 is disposed in recess 11a of concentric electromagnet 11. However, outer and inner circumferential surfaces of permanent magnet 51 have different polarities.

FIG. 14 is a view of an arrangement in which flat ring-like permanent magnets 52a and 52b are disposed with respect to the N pole as the center of concentric electromagnet 11. This arrangement is suitable for an electrode having a large area.

In this case, by mechanically moving the permanent magnet, or by moving and deforming it by a current change in the electromagnet, better uniformity can be obtained.

FIG. 15 is a view of an arrangement in which, contrary to FIG. 13, flat ring-like permanent magnet 53 is used as an outer circumferential magnet.

FIG. 16 is a view of an arrangement in which two flat ring-like permanent magnets 54a and 54b are used.

Note that in the above embodiments, the electromagnet and the permanent magnet are used, but the present invention is not limited to the above embodiment. For example, a permanent magnet may be used instead of the electromagnet or vice versa, or only the electromagnets or the permanent magnets may be used.

In addition, in the above embodiments, the description has been made with reference to the case wherein the magnetron plasma apparatus according to the present invention is applied to sputtering or etching. However, the represent invention is not limited to the above embodiments but can be applied to plasma CVD, plasma oxidation, plasma nitriding, ashing, and the like.

What is claimed is:

1. A magnetic plasma apparatus comprising:
   magnetic field generating means for generating a magnetic field, said magnetic field generating means including a concentric first magnet having a periphery pole piece of one polarity and a center pole piece of an opposite polarity with a ring-like recess formed therebetween, and a ring-like second magnet arranged in the ring-like recess of said concentric first magnet, said ring-like second magnet having a polarity opposite that of the first magnet for forming a magnetic field distribution having an intensity distributed in a direction perpendicular to a plane of said periphery and center poles of the first magnet to produce at a first portion of said magnetic field distribution near the plane of the first magnet a first magnetic field generated by the first magnet and weakened by a second magnet field of the opposite polarity generated by the second magnet and at a second portion of said magnetic field distribution next to the first portion in the perpendicular direction a maximum intensity field produced by only the first magnetic field; and
   plasma generating means for generating a plasma, said plasma generating means including an electrode arranged at the first portion of the magnetic field distribution and connected to a plasma power source to form a maximum density portion of the plasma at the maximum intensity field of the second portion of said magnetic field distribution.

2. An apparatus according to claim 1, wherein said electrode is disposed on a surface of said first magnet.

3. A magnetic plasma apparatus comprising:
   magnetic field generating means for generating a magnetic field, said magnetic field generating means including a concentric first magnet having a periphery pole piece of one polarity and a center pole piece of an opposite polarity, and a ring-like second magnet arranged on an outer circumferential surface of and above said concentric first magnet and having a polarity opposite to that of the first magnet for forming a magnetic field distribution having an intensity distributed in a direction perpendicular to a plane of said periphery and center poles of the first magnet to produce at a first portion of said magnetic field distribution near the plane of the first magnet a first magnetic field generated by the first magnet and weakened by a second magnet field of the opposite polarity generated by the second magnet and at a second portion of said magnetic field distribution next to the first portion in the perpendicular direction a maximum intensity field is produced by only the first magnetic field; and
   plasma generating means for generating a plasma, said plasma generating means including an electrode arranged at the first portion of the magnetic field distribution and connected to a plasma power source for producing an electric field for generating the plasma from the electrode to form a maximum density portion of the plasma at the second portion of the magnetic field distribution.

4. A magnetic plasma apparatus comprising:
   plasma generating means for generating a plasma including an ion sheath portion and a plasma concentrated portion separated from the ion sheath portion, the plasma generating means including an electrode connected to a plasma power source to produce an electric field for generating the plasma from the electrode; and magnetic field generating means for generating a magnetic field above the electrode, said magnetic field generating means including a first magnet for generating a main field and a second magnet for generating a supplemental field, the supplemental field functioning at the ion sheath portion to weaken the main field, and a maximum intensity field formed at the plasma concentrated portion apart from the sheath portion in a direction perpendicular to a surface of the electrode.

5. An apparatus according to claim 4, wherein said plasma generating means further comprises another electrode disposed to face said first-mentioned electrode with said plasma being formed therebetween, said means for applying to said another electrode an electric potential different from that of said first-mentioned electrode.

6. An apparatus according to claim 4, wherein said first magnet includes a first periphery magnetic pole piece of one polarity, a center magnetic pole piece of the one polarity and an intermediate magnetic pole piece of the one polarity and an intermediate magnetic pole piece of an opposite polarity disposed between the periphery and center pole pieces, the periphery, intermediate and center pole pieces being arranged concentrically on a common plane.

7. An apparatus according to claim 4, wherein said second magnet includes a plurality of stacked magnet layers.

8. An apparatus according to claim 4, wherein said second magnet includes a flat ring type magnet.

9. An apparatus according to claim 4, wherein said first magnet includes an electromagnet.

10. An apparatus according to claim 4, wherein said second magnet includes a permanent magnet.

* * * * *